United States Patent [19]
Park et al.

[11] Patent Number: 5,821,812
[45] Date of Patent: Oct. 13, 1998

[54] WIDEBAND AMPLIFIER USING PARALLEL FEEDBACK TRANSISTOR

[75] Inventors: Moon-Pyung Park, Daejeon; Hyeon-Cheol Ki, Seongnam; Sung-Ho Park; Tae-Woo Lee, both of Daejeon; Kie-Moon Song, Seoul, all of Rep. of Korea

[73] Assignees: Korea Telecommunication Authority, Daejeon; Electronics and Telecommunications Research Institute, Seoul, both of Rep. of Korea

[21] Appl. No.: 747,083

[22] Filed: Nov. 13, 1996

[30] Foreign Application Priority Data

Dec. 15, 1995 [KR] Rep. of Korea .................. 1995 50533

[51] Int. Cl.$^6$ ............................... H03F 3/45; H03F 1/14
[52] U.S. Cl. ............................................ 330/260; 330/292
[58] Field of Search .................................... 330/252, 260, 330/292, 310, 311

[56] References Cited

U.S. PATENT DOCUMENTS 5,525,930  6/1996  Pothast et al. ...................... 330/292 X

OTHER PUBLICATIONS

A Versatile Si–Bipolar Driver Circuit with High Output Voltage Swing for External and Direct Laser Modulation in 10 Gb/s Optical–Fiber Links; H.–M. Rein, R. Schmid, P. Weger, T. Smith, T. Herzog, and R. Lachner; 1994; pp. 1014–1020.

ALGaAs/GaAs HBT IC's for High–Speed Lightwave Transmission Systems; Klaus Runge, Detlef Daniel, R.D. Standley, James L. Gimlett, Randall B. Nubling, Richard L. Pierson, Steve M. Beccue, Keh–Chung Wang, Neng–Haung Sheng, Mau–Chung F. Chang, Dong Ming Chen and Peter M. Asbeck; 1992; pp. 1332–1339.

Silicon Bipolar Laser Driving IC for 5 Gb/s and 45–mA Modulation Current and its Application in a Demonstrator System; Rainer H. Derksen and Horst Wernz; 1993; pp. 824–828.

9GHz Bandwidth, 8–20dB Controllable–Gain Monolithic Amplifier Using ALGaAs/GaAs HBT Technology; C.J. Pinzone, N.D. Gerrard, R.D. Dupuis, N.T. Ha, H.S. Luftman; 1989; pp. 1317–1318.

*Primary Examiner*—Steven Mottola
*Attorney, Agent, or Firm*—Antonelli, Terry, Stout & Kraus, LLP

[57] ABSTRACT

In a wideband amplifier whose bandwidth is increased using a parallel feedback transistors(PFT), capacitive elements are connected between the first and seventh nodes which are emitters of the seventh and eighth transistors which are parallel feedback transistors, and alternating current(AC) grounds, wherein outputs are supplied from the first and seventh nodes, and the emitter follower buffers are coupled to the first and seventh nodes so that a negative feedback current is leaked through the collector parasitic capacitances of emitter follower buffer transistors. The bandwidth of the amplifier is greatly increased without making the circuit complex.

5 Claims, 4 Drawing Sheets

WIDEBAND AMPLIFIER USING PARALLEL FEEDBACK TRANSISTOR

BACKGROUND OF THE INVENTION

The present invention relates to a wideband amplifier, and more particularly, to a wideband amplifier whose bandwidth is increased using a parallel feedback transistor (PFT).

Various methods have been proposed to increase the bandwidth of a laser diode(LD) driver integrated circuit(IC) which is a transmission system for optical communication.

The first proposed method is a parallel feedback method using the PFT, by which the bandwidth of the circuit is increased by using the PFT and a load resistance (here, the bandwidth is 9 GHz.) and the gain thereof is controlled by changing a bias current (see "9 GHz bandwidth, 8–20 dB controllable-gain monolithic amplifier using AlGaAs/GaAs HBT technology" by N. Ishihara et al., Electron Lett. vol. 25, pp. 1317–1318, September 1989).

The second proposed method is a shunt feedback method using an emitter follower and a resistance, by which 11 Gb/s is obtained from an eye diagram of a differential output port (see "AlGaAs/GaAs HBT Ics for high-speed lightwave transmission systems" by K. Runge et al., IEEE J. Solid-State Circuits, vol. 27, pp. 1332–1340, October 1992).

In addition, a method for externally controlling an internal voltage swing of an adapting port to obtain 45 mA modulation current and 5 GHz bandwidth is disclosed in "Silicon bipolar laser driving IC for 5 Gb/s and 45 mA modulation current and its application in a demonstrator system" by R. H. Derksen and H. Wernz, IEEE J. Solid-State Circuits, vol. 28, pp. 824–828, July, 1993).

The aforementioned related arts are directed to improving properties of the LD drier IC for the optical communication transmission system.

FIG. 1 shows a conventional wideband amplifier having a PFT, which includes an external differential amplifier 100, an internal differential amplifier 200, an emitter follower buffer 300 and a load 400.

The external differential amplifier 100 includes a first node 1, a first resistive element 2, a second noode 3, a third node 4, a first transistor 5, a fourth node 6, a first current source 7, a fifth node 8, a second transistor 9, a sixth node 10, a fourth resistive element 11 and a seventh node 12.

The internal differential amplifier 200 includes a second resistive element 15, an eighth node 16, a third transistor 17, a ninth node 18, a second current source 19, a sixth transistor 20, a tenth node 21 and third resistive element 22.

The emitter follower buffer 300 includes a fourth transistor 23, a third current source 25, a fourth current source 26, a twelfth node 27 and a fifth transistor 28.

The load 400 includes a fifth resistive element 29, a thirteenth node 30, a ninth transistor 31, a fourteenth node 32, a fifth current source 33, a tenth transistor 34, a fifteenth node 35 and a sixth resistive element 36.

The outputs of the wideband amplifier having the aforementioned configuration are output via the eighth node 16 and tenth node 21.

Also, the collectors of the fourth and fifth transistors 23 and 28 are connected to the sixteenth node 37 to which power $V_{cc}$ is applied. The above current sources are all connected to the seventeenth node 38 to which power $-V_{EE}$ is applied.

According to such a configuration, the external differential amplifier 100 and internal differential amplifier 200 are negatively fed back via seventh and eighth transistors 13 and 14 which are PETS to obtain wideband characteristics.

At this time, the outputs are supplied from the eighth node 16 and tenth node 21, and the voltage gain(Av1) characteristics is written as:

$$A_{v1} = \frac{g_{m1}/R_8}{1 + sC_{in}R_B(g_{m2}R_L)} \qquad (1)$$

where $g_{m1}$ is a transconductance of the first transistor 5 and second transistor 9, $g_{m2}$ and $C_{in}$ are a transconductance and an input capacitance of third transistor 17 and sixth transistor 20, respectively. Thus, the bandwidth becomes $g_{m2} \cdot R_L / C_{in} \cdot R_B$.

If the emitter follower buffer 300 is connected, the parasitic capacitances $C_c$ between the base and collector of the fourth transistor 23 and fifth transistor 28 are connected to the eighth and sixteenth nodes 16 and 37, and the tenth and sixteenth nodes 21 and 37 respectively. Thus, the voltage gain $A_v$ at the eleventh and twelfth node 24 and 27 considering the parasitic capacitance $C_c$ is written as:

$$A_v = \frac{g_{m1}/R_B}{1 + sC_{in}R_B(g_{m2}R_L) + s^2 C_{in}C_c R_B/g_{m2}} \qquad (2)$$

Therefore, the emitter follower buffer 300 functions to reduce the bandwidth somewhat.

On the other hand, the output resistance $R_0$ at the eleventh and twelfth nodes 24 and 27 is as follows. In this case, the input resistance of the third and sixth transistors 17 and 20 is set as $r_{n2}$, and input resistance and transconductance of the fourth and fifth transistors 23 and 28 are set as $r_{n4}$ and $g_{m4}$, respectively.

$$R_o = \frac{R_B + r_{n2}}{r_{n2}g_{m2}r_{n4}g_{m4}} \qquad (3)$$

The wideband amplifier should exhibit wideband characteristics in a state where the load is connected. In consideration of the structure of the PFT wideband amplifier, a load which has a differential amplifier structure is generally connected.

When the load 400 is connected, an input resistance for the load becomes an output resistance $R_c$ of the preceding stage, and the voltage gain $A_{VL}$ at the thirteenth and fifteenth nodes 30 and 35 is written as:

$$A_{VL} = \frac{-g_{m5}R_{LO}}{1 + sC_{in5}(r_{n5}/R_0)} \qquad (4)$$

where $r_{n5}$ and $g_{m5}$ are an input resistance and a transconductance of the ninth transistor 31 and tenth transistor 34, and $C_{in5}$ is an input parasitic capacitance.

If the load 400 is connected, a pole is added by the load 400 and the bandwidth is reduced.

SUMMARY OF THE INVENTION

Therefore, it is an object of the present invention to provide a wideband amplifier adopting a heterojunction bipolar transistor(HBT), whose bandwidth is increased by reducing the factors which affect the bandwidth of a conventional wideband amplifier having parallel feedback transistors (PFTS) by altering the structure of the output stage of the PFTS.

First, to accomplish the above object of the present invention, capacitive elements are connected between the seventh and eighth node of the first and seventh transistors which are parallel feedback transistors, and alternating current (AC) grounds.

Second, outputs are supplied from the first and seventh nodes of the seventh and eighth transistors. And third, emitter follower buffers are coupled to the first and seventh nodes so that a negative feedback current is leaked through the collector parasitic capacitances of emitter follower buffer transistors.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
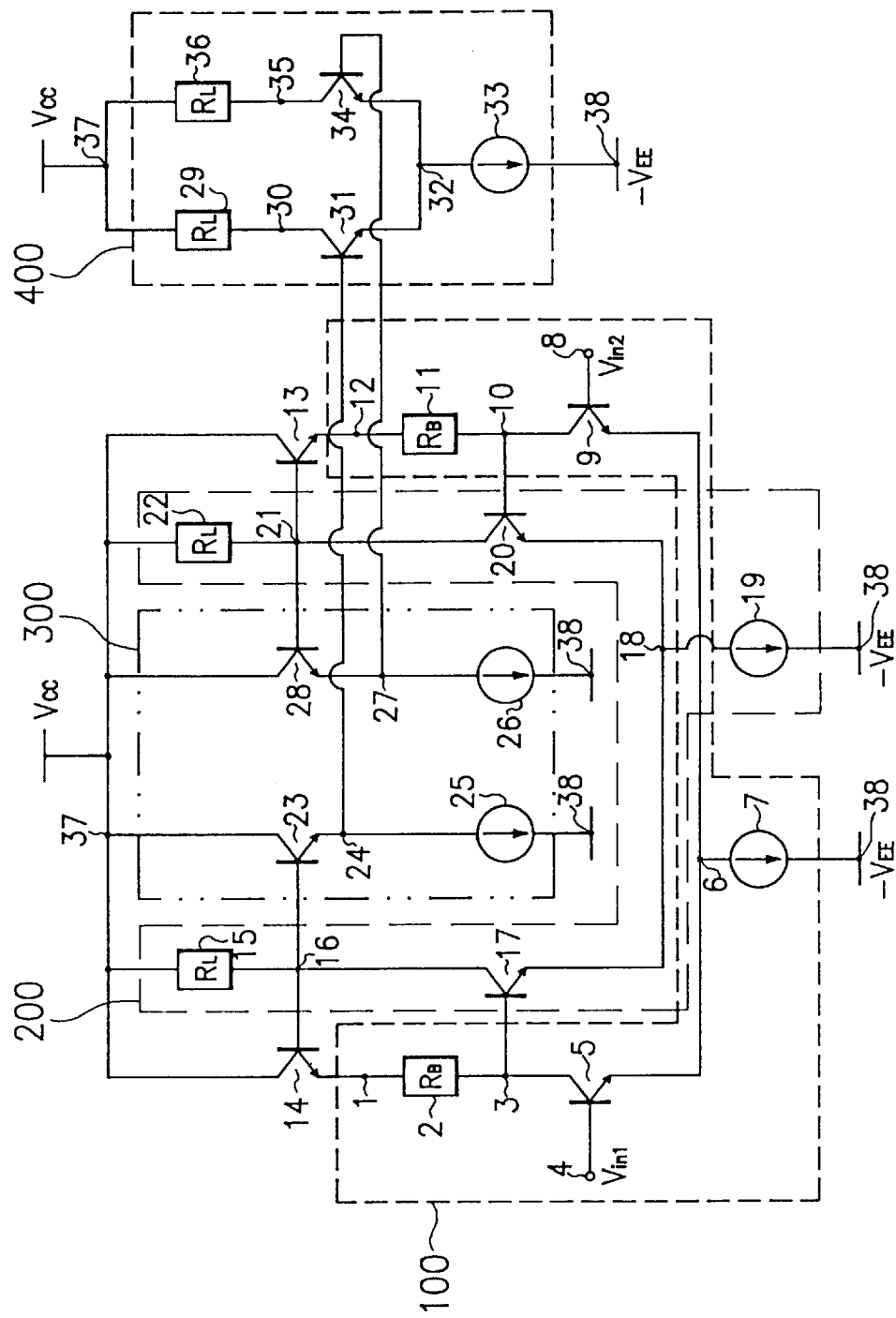
FIG. 1 is circuit diagram of a conventional PFT wideband amplifier.
Figure 2:
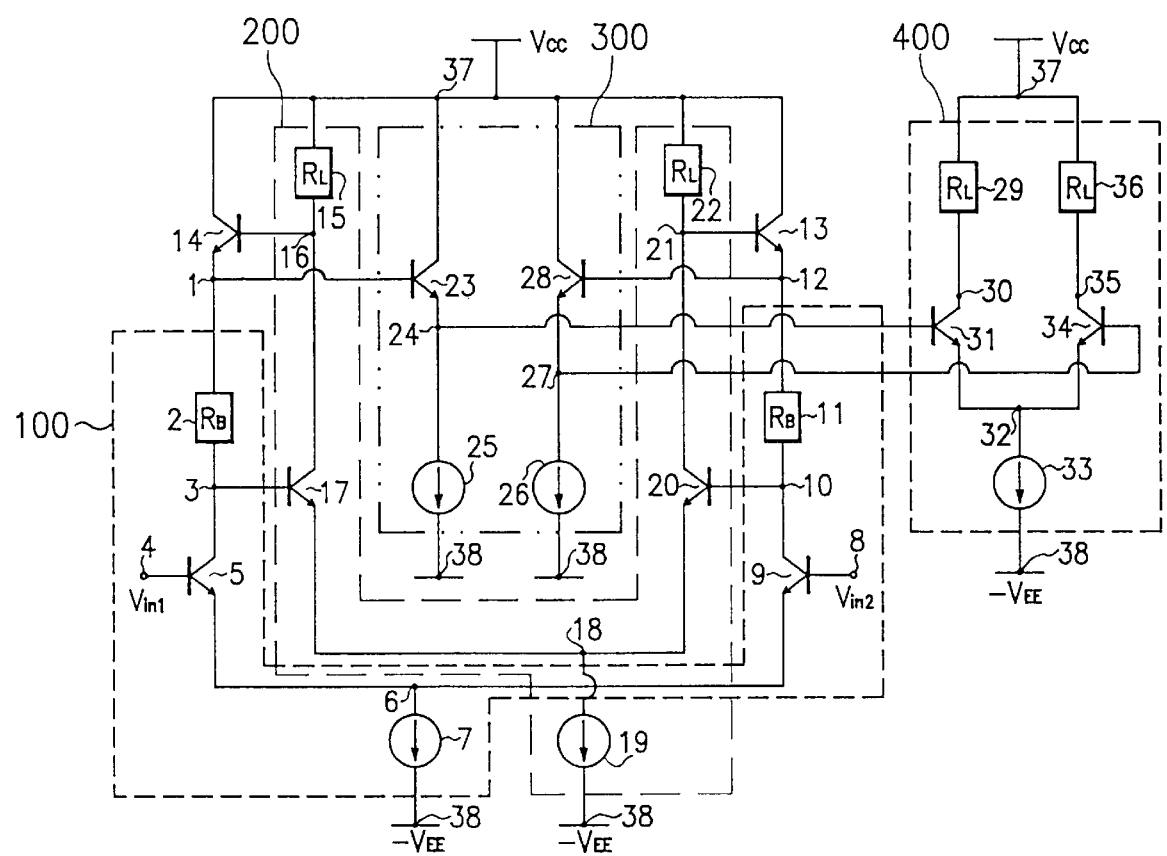
FIG. 2 is circuit diagram of a PFT wideband amplifier according to the present invention.

The wideband amplifier according to the present invention shown in FIG. 2 is different from that shown in FIG. 1 in that emitter follower buffer transistors 23 and 28 are connected to the first node 1 and the seventh node 12, respectively. This structure allows the seventh and eighth transistors 13 and 14 which are parallel feedback transistors (PFTs) to supply outputs. The output voltage $V_e$ of the first and seventh nodes 1 and 12 which are the PFT emitters has the relationship as expressed in the following equation(5) with respect to the $V_o$ of eighth and tenth nodes 16 and 21:

$$V_o - V_e = r_{n3} i_b \quad (5)$$

where $r_{n3}$ and $ib$ represent the input resistance and the base current of the seventh and eighth transistors 13 and 14, respectively.

The magnitude and variation of $i_b$ can contribute to the voltage gain decrease and bandwidth variation at the first and seventh nodes 1 and 12, respectively.

However, since the value of $i_b$ is very small, the voltage gain decrease is extremely small. Furthermore, the bandwidth change due to the variation of $i_b$ is negligible.

Therefore, the voltage gain characteristics of the first and seventh nodes 1 and 12 are almost the same as those of the eighth and tenth nodes 16 and 21, except for a slight decrease in the voltage gain. The voltage gain $A_{VE}$ at the first and seventh nodes 1 and 12 is approximated as:

$$A_{Ve1} = \frac{g_{m1} R_B - g_{m1}/g_{m3}}{1 + s C_{in} R_B/(g_{m2} R_L)} \quad (6)$$

where $g_{m3}$ is a transconductance of the first seventh transistor 13 and eighth transistor 14.

If the emitter follower buffer 300 is connected, the parasitic capacitances $C_c$ are connected to the first node 1 and fifth current source 33, and the seventh node 12 and fifth current source 33. The voltage gain $A_{ve}$ at the eleventh and twelfth nodes 24 and 27 is written as:

$$A_{ve} = \frac{g_{m1} R_B (1 + S C_B/g_{m3})}{1 + S C_{in} R_B/(g_{m2} R_L)} \quad (7)$$

Compared with the equation(2), zero of $1+sC_B/g_{m3}$ is generated, which cancels the pole effect to increase the bandwidth.

In other words, the current negatively fed back from the eighth and tenth nodes 16 and 21 to the second and sixth nodes 3 and 10 is leaked via the parasitic capacitance $C_c$ at a radio frequency region to increase the gain at that frequency region, thereby expanding the bandwidth.

Such an effect occurs when capacitive elements are connected between the first and seventh nodes 1 and 12, and the AC grounds (the sixteenth and seventeenth nodes 37 and 38 in FIG. 2). As the capacitive elements, capacitive diodes or capacitors may be adopted without using the collector parasitic capacitance $C_c$ of the fourth and fifth transistors 23 and 28.

Figure 3:
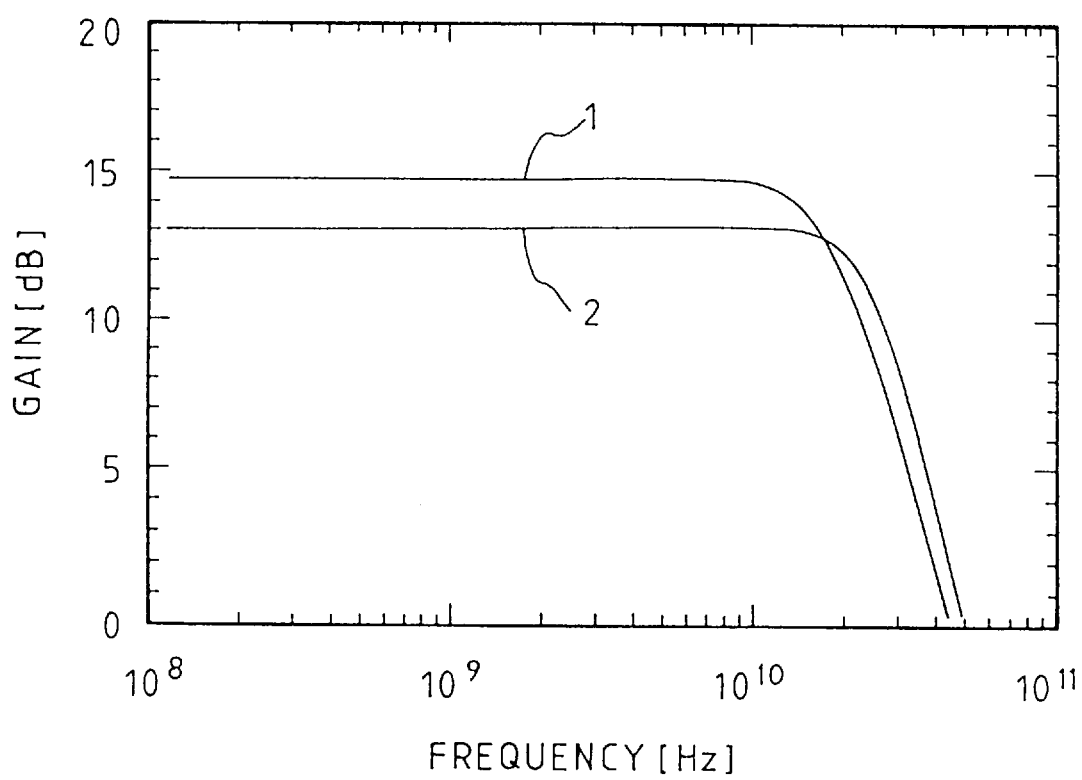
FIG. 3 is a graph showing the change in bandwidth characteristics depending on a negative feedback leakage current.

FIG. 3 shows a Spice simulation result using the measured parameters of an actually manufactured HBT, in which curve 1 represents bandwidth characteristics of the voltage gain $A_V$ of the conventional art, and curve 2 represents bandwidth characteristics of the voltage gain $A_{ve}$ of the present invention. It is understood from FIG. 3 that the bandwidth of $A_{ve}$ is increased, compared with that of $A_V$.

The output resistance $R_{oe}$ at the eleventh and twelfth nodes 24 and 27 is written as:

$$R_{oe} = (R_B = r_{n2})/(r_{n2}\, g_{m2}\, g_{m3}\, R_L) \quad (8)$$

whcih shows that the output resistance $R_{oe}$ is decreased by $1/g_{m3} R_L$, compared with the output resistance $R_o$, shown in the equation(3).

When the differential amplifier type load 400 is connected, the voltage gain $A_{veL}$ at the thirteenth and fifteenth nodes 30 and 35 is written as:

$$A_{veL} = \frac{g_{m5} R_L}{1 + s C_{in5}(r_{n5} R_{oe})(r_{n5}/R_{oe})} A_{ve} \quad (9)$$

Compared with equation (4), $R_{oe}$ is decreased to $1/g_{m3} R_L$ of $R_o$. Thus, it is understood that the pole is moved to the higher frequency range, and thereby increases the bandwidth.

Figure 4:
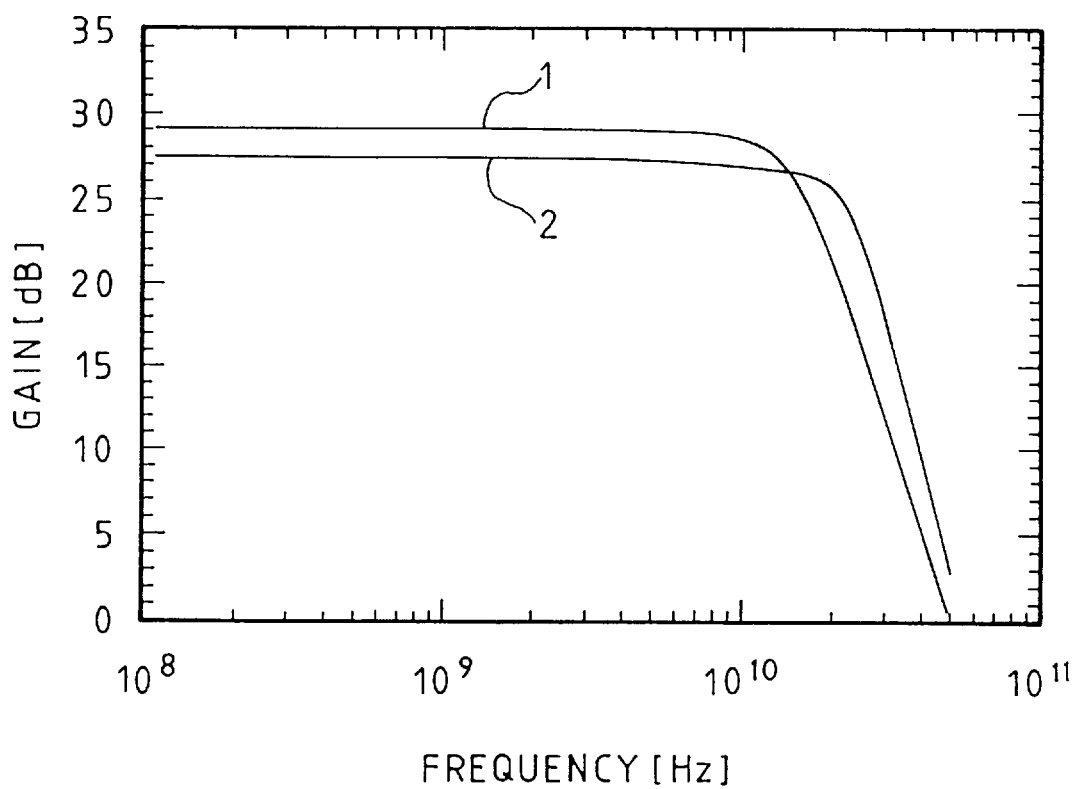
FIG. 4 is a graph showing the change in bandwidth characteristics depending on the change of output nodes.

FIG. 4 shows a Spice simulation result when $R_L$ is 50 ohm and modulation current is 20 mA, in which curve 1 represents bandwidth characteristics of the voltage gain $A_{VL}$ of the conventional art, and curve 2 represents bandwidth characteristics of the voltage gain $A_{veL}$ of the present invention. It is understood that the bandwidth of $A_{veL}$ is considerably increased, compare with that of $A_{VL}$.

As described above, in contrast to the aforementioned prior arts, the present invention discloses a wideband amplifier using the PFT, in which capacitive elements are connected between the emitter nodes of the PFTs and AC grounds, outputs are supplied from the emitter nodes of the PFT, and emitter follower buffers are coupled to emitter nodes so that a negative feedback current is leaked through the collector parasitic capacitances of emitter follower buffer transistors.

According to the present invention, a wideband amplifier whose bandwidth is increased considerably by using a parasitic capacitance and changing output nodes can be implemented without causing complexity of the circuit, compared with the conventional PFT wideband amplifier.

Also, the wideband amplifier according to the present invention can be adopted to the amplifying stage of the optical communication analog IC(e.g., LD driver or limiting amplifier) manufactured using HBT, thereby considerably expanding the bandwidth of the IC.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A wideband amplifier utilizing parallel feedback transistors, said wideband amplifier comprising:

an external differential amplifier having a first node, a first resistive element, a second node, a third node, a first transistor, a fourth node, a first current source, a fifth node, a second transistor, a sixth node, a fourth resistive element and a seventh node;

an internal differential amplifier having a second resistive element, an eighth node, a third transistor, a ninth node, a second current source, a sixth transistor, a tenth node and a third resistive element;

an emitter follower buffer having a fourth transistor, a third current source, a fourth current source, a twelfth node, and a fifth transistor; and a load having a fifth resistive element, a thirteenth node, a ninth transistor, a fourteenth node, a fifth current source, a tenth transistor, fifteenth node and a sixth resistive element;

wherein capacitive elements are connected between first and seventh nodes of parallel feedback transistors and alternating current (AC) grounds.

2. A wideband amplifier as claimed in claim 1, wherein outputs of the wideband amplifier are supplied from the first and seventh nodes of the seventh and eight transistors which are parallel feedback transistors.

3. A wideband amplifier, comprising:

an external differential amplifier having a first node, a first resistive element, a second node, a third node, a first transistor, a fourth node, a first current source, a fifth node, a second transistor, a sixth node, a fourth resistive element and a seventh node;

an internal differential amplifier having a second resistive element, an eighth node, a third transistor, a ninth node, a second current source, a sixth transistor, a tenth node and a third resistive element;

a load having a fifth resistive element, a thirteenth node, a ninth transistor, a fourteenth node, a fifth current source, a tenth transistor, a fifteenth node and a sixth resistive element;

wherein emitter follower buffers are fed back to the first and seventh nodes so that a negative feedback current is leaked through the collector parasitic capacitances of emitter follower buffer transistors.

4. A wideband amplifier as claimed in claim 3, wherein outputs of the wideband amplifier are supplied from the first and seventh nodes.

5. The wideband amplifier as claimed in claim 1, wherein said emitter/follower buffers are connected to the first and seventh nodes of the parallel feedback transistors so that a negative feedback current is leaked through parasitic collector capacitances of emitter follower buffer transistors.

* * * * *